US008329577B2

(12) United States Patent
Lehr et al.

(10) Patent No.: US 8,329,577 B2
(45) Date of Patent: Dec. 11, 2012

(54) METHOD OF FORMING AN ALLOY IN AN INTERCONNECT STRUCTURE TO INCREASE ELECTROMIGRATION RESISTANCE

(75) Inventors: Matthias Lehr, Dresden (DE); Moritz-Andreas Meyer, Dresden (DE); Eckhard Langer, Radebeul (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/015,293

(22) Filed: Jan. 27, 2011

(65) Prior Publication Data

US 2011/0124189 A1    May 26, 2011

Related U.S. Application Data

(62) Division of application No. 12/172,555, filed on Jul. 14, 2008, now abandoned.

(30) Foreign Application Priority Data

Jan. 31, 2008   (DE) .................. 10 2008 007 001

(51) Int. Cl.
    *H01L 21/44* (2006.01)
(52) U.S. Cl. .................. 438/659; 438/677; 438/678
(58) Field of Classification Search .................. 438/659
    See application file for complete search history.

(56) References Cited

U.S. PATENT DOCUMENTS

| 6,117,770 A | 9/2000 | Pramanick et al. ............. 438/659 |
| 6,426,289 B1 | 7/2002 | Farrar ............................. 438/670 |
| 6,464,568 B2 * | 10/2002 | Miller et al. ..................... 451/41 |
| 6,500,749 B1 | 12/2002 | Liu et al. ......................... 438/618 |
| 6,633,085 B1 | 10/2003 | Besser et al. .................... 257/774 |
| 6,674,170 B1 | 1/2004 | Ngo et al. ......................... 257/774 |
| 6,731,006 B1 | 5/2004 | Halliyal et al. .................. 257/758 |
| 6,833,321 B2 | 12/2004 | Hau-Riege et al. ............. 438/659 |
| 6,977,220 B2 * | 12/2005 | Marieb et al. .................. 438/659 |
| 7,074,709 B2 | 7/2006 | Young ............................. 438/625 |
| 7,115,502 B2 | 10/2006 | Jan .................................. 438/659 |
| 2002/0115292 A1 * | 8/2002 | Andricacos et al. ............ 438/687 |
| 2005/0009331 A1 | 1/2005 | Park ................................ 438/672 |

FOREIGN PATENT DOCUMENTS

WO    WO 2007/060640 A2    5/2007

OTHER PUBLICATIONS

Translation of Official Communication from German Patent Office for German Patent Application No. 10 2008 007 001.7-33 dated Nov. 14, 2008.

* cited by examiner

*Primary Examiner* — N Drew Richards
*Assistant Examiner* — Michael Jung
(74) *Attorney, Agent, or Firm* — Williams, Morgan & Amerson, P.C.

(57) ABSTRACT

By introducing a metallic species into an exposed surface area of a copper region, the electromigration behavior of this surface area may be significantly enhanced. The incorporation of the metallic species may be accomplished in a highly selective manner so as to not unduly affect dielectric material positioned adjacent to the metal region, thereby essentially avoiding undue increase of leakage currents.

9 Claims, 7 Drawing Sheets

METHOD OF FORMING AN ALLOY IN AN INTERCONNECT STRUCTURE TO INCREASE ELECTROMIGRATION RESISTANCE

CROSS-REFERENCE TO RELATED APPLICATION

This is a divisional of co-pending application Ser. No. 12/172,555, filed Jul. 14, 2008.

BACKGROUND OF THE INVENTION

1. Field of the Invention

Generally, the present disclosure relates to the formation of microstructures, such as advanced integrated circuits, and, more particularly, to the formation of conductive structures, such as copper-based metallization layers, and techniques to reduce electromigration and other stress-induced mass transport effects during operation.

2. Description of the Related Art

In the field of fabricating modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these interconnect lines are also reduced to compensate for a reduced amount of available floor space and for an increased number of circuit elements provided per unit die area, as typically the number of interconnections required increases over-proportionally relative to the number of circuit elements. Thus, a plurality of stacked "wiring" layers, also referred to as metallization layers, is usually provided, wherein individual metal lines of one metallization layer are connected to individual metal lines of an overlying or underlying metallization layer by so-called vias. Despite the provision of a plurality of metallization layers, reduced dimensions of the interconnect lines are necessary to comply with the enormous complexity of, for instance, modern CPUs, memory chips, ASICs (application specific ICs) and the like. The reduced cross-sectional area of the interconnect structures, possibly in combination with an increase of the static power consumption of extremely scaled transistor elements, may result in considerable current densities in the metal lines, which may even increase with every new device generation.

Advanced integrated circuits, including transistor elements having a critical dimension of 0.1 µm and even less, may, therefore, typically be operated at significantly increased current densities of up to several kA per $cm^2$ in the individual interconnect structures, despite the provision of a relatively large number of metallization layers, owing to the significant number of circuit elements per unit area. Operating the interconnect structures at elevated current densities, however, may entail a plurality of problems related to stress-induced line degradation, which may finally lead to a premature failure of the integrated circuit. One prominent phenomenon in this respect is the current-induced mass transport in metal lines and vias, also referred to as "electromigration." Electromigration is caused by momentum transfer of electrons to the ion cores in the conductors, resulting in a net momentum in the direction of electron flow. In particular, at high current densities, a significant collective motion or directed diffusion of atoms may be caused due to electromigration in the interconnect metal, wherein the presence of respective diffusion paths may have a substantial influence on the displaced amount of mass resulting from the momentum transfer. Thus, electromigration may lead to the formation of voids within and hillocks next to the metal interconnect, thereby resulting in reduced performance and reliability or complete failure of the device. For instance, aluminum lines embedded into silicon dioxide and/or silicon nitride are frequently used as metal for metallization layers, wherein, as explained above, advanced integrated circuits having critical dimensions of 0.1 µm or less, may require significantly reduced cross-sectional areas of the metal lines and, thus, increased current densities, which may render aluminum less attractive for the formation of metallization layers.

Consequently, aluminum is being replaced by copper, a material with significantly lower resistivity and improved resistance to electromigration even at considerably higher current densities compared to aluminum. The introduction of copper into the fabrication of microstructures and integrated circuits comes along with a plurality of severe problems residing in copper's characteristic to readily diffuse in silicon dioxide and a plurality of low-k dielectric materials, which are typically used in combination with copper in order to reduce the parasitic capacitance within complex metallization layers. In order to provide the necessary adhesion and to avoid the undesired diffusion of copper atoms into sensitive device regions, it is, therefore, usually necessary to provide a barrier layer between the copper and the dielectric material in which the copper-based interconnect structures are embedded. Although silicon nitride is a dielectric material that effectively prevents the diffusion of copper atoms, selecting silicon nitride as an interlayer dielectric material may be less than desirable, since silicon nitride exhibits a moderately high permittivity, thereby increasing the parasitic capacitance of neighboring copper lines, which may result in non-tolerable signal propagation delays. Hence, a thin conductive barrier layer that also imparts the required mechanical stability to the copper is usually formed to separate the bulk copper from the surrounding dielectric material, thereby reducing copper diffusion into the dielectric materials and also reducing the diffusion of unwanted species, such as oxygen, fluorine and the like, into the copper. Furthermore, the conductive barrier layers may also provide highly stable interfaces with the copper, thereby reducing the probability of significant mass transport at these interfaces, which are typically a critical region in view of increased diffusion paths. Currently, tantalum, titanium, tungsten and their compounds, with nitrogen and silicon and the like are preferred candidates for a conductive barrier layer, wherein the barrier layer may comprise two or more sub-layers of different composition to meet the requirements in terms of diffusion suppressing and adhesion properties.

Another characteristic of copper significantly distinguishing it from aluminum is the fact that copper may not be readily deposited in larger amounts by chemical and physical vapor deposition techniques, in addition to the fact that copper may not be efficiently patterned by anisotropic dry etch processes, thereby requiring a process strategy that is commonly referred to as the damascene or inlaid technique. In the damascene process, first a dielectric layer is formed, which is then patterned to include trenches and/or vias which are subsequently filled with copper, wherein, as previously noted, prior to filling in the copper, a conductive barrier layer is formed on sidewalls of the trenches and vias. The deposition of the bulk copper material into the trenches and vias is usually accomplished by wet chemical deposition processes, such as electroplating and electroless plating, thereby requiring the reliable filling of vias with an aspect ratio of 5 and more with a diameter of 0.3 μm or even less, in combination with trenches having a width ranging from 0.1 μm to several μm. Electrochemical deposition processes for copper are well established in the field of electronic circuit board fabrication. However, the void-free filling of high aspect ratio vias is an extremely complex and challenging task, wherein the characteristics of the finally obtained copper-based interconnect structure significantly depend on process parameters, materials and geometry of the structure of interest. Since the geometry of interconnect structures is substantially determined by the design requirements and may, therefore, not be significantly altered for a given microstructure, it is of great importance to estimate and control the impact of materials, such as conductive and non-conductive barrier layers, of the copper microstructure and their mutual interaction on the characteristics of the interconnect structure to insure both high yield and the required product reliability. In particular, it is important to identify, monitor and reduce degradation and failure mechanisms in interconnect structures for various configurations to maintain device reliability for every new device generation or technology node.

Accordingly, a great deal of effort has been made in investigating the degradation of copper interconnects, especially in combination with low-k dielectric materials having a relative permittivity of 3.1 or less, in order to find new materials and process strategies for forming copper-based lines and vias with a low overall permittivity. Although the exact mechanism of electromigration in copper lines is still not quite fully understood, it turns out that voids positioned in and on sidewalls and especially at interfaces to neighboring materials may have a significant impact on the finally achieved performance and reliability of the interconnects.

One prominent failure mechanism which is believed to significantly contribute to a premature device failure is the electromigration-induced material transport, particularly at an interface of the copper lines to the dielectric cap layer, which may be deposited after filling in the copper on the basis of the electrochemical deposition techniques. The interface characteristics may, therefore, be determined by the previous manufacturing steps, resulting in a specific texture of the copper, and the material characteristics of the cap material, which is frequently provided in the form of silicon nitride, silicon carbide, nitrogen-containing silicon carbide and the like. Recent research results seem to indicate that the electromigration behavior of the copper/cap layer interface may be improved by providing metallic impurities at the interface. It is believed that these impurity atoms may tightly adhere to the copper surface and therefore suppress the migration of copper atoms, which may otherwise be caused by the momentum transfer of the electrons at the high current density that typically prevails in the metal line during operation. It has, therefore, been proposed to form copper alloys on the exposed copper surface by selective electrochemical deposition techniques prior to depositing the dielectric material. Although enhanced electromigration behavior may be achieved, the contamination of the surrounding dielectric material by the metallic components during the selective deposition technique may result in increased line-to-line leakage.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to enhanced techniques for improving the electromigration behavior in the metallization structure of advanced semiconductor devices. To this end, an appropriate metallic species may be provided at a surface of the metal while substantially avoiding the metallic species in the adjacent dielectric material in the completed metallization layer so as to reduce the risk of creating increased leakage currents. In illustrative aspects disclosed herein, appropriate thin films including the metallic species may be selectively deposited on the basis of an appropriately prepared deposition mask, thereby substantially avoiding a contamination of the adjacent dielectric material. In other illustrative aspects, an appropriate material layer including the metallic species may be deposited and patterned, thereby removing the metallic species from the dielectric material, wherein a subsequent diffusion process may finally result in the incorporation of the metallic species in the underlying metal region. In other illustrative aspects, the metallic species may be efficiently incorporated into a surface area by particle bombardment, such as ion implantation, plasma treatment and the like.

One illustrative method disclosed herein comprises forming a mask above a metal region formed in a dielectric material of a metallization layer of a semiconductor device, wherein the mask exposes a surface of the metal region and covers the dielectric material. The method further comprises applying a metallic species through the mask to the exposed surface of the metal region and removing the mask. Additionally, the method comprises forming a dielectric cap material above the metallization layer, wherein the dielectric cap material covers the surface containing the metallic species.

A further illustrative method disclosed herein comprises forming a metal layer above a dielectric layer of a metallization layer of a semiconductor device so as to fill an opening in the dielectric layer. The method further comprises performing an implantation process to introduce a metallic species through an exposed surface of the metal layer. Moreover, the method comprises removing excess material of the metal layer from the dielectric layer to form a metal region in the dielectric layer, wherein the metal region has a surface comprising the metallic species.

A still further illustrative method disclosed herein comprises forming a via opening in a dielectric layer, wherein the via opening extends to and exposes a portion of a first metal region formed in a first metallization layer of a semiconductor device. The method additionally comprises performing an ion implantation process to introduce a metallic species into the exposed portion of the first metal region. Finally, the via opening is filled with a metal.

BRIEF DESCRIPTION OF THE DRAWINGS

The disclosure may be understood by reference to the following description taken in conjunction with the accompanying drawings, in which like reference numerals identify like elements, and in which.

Figure 1A:
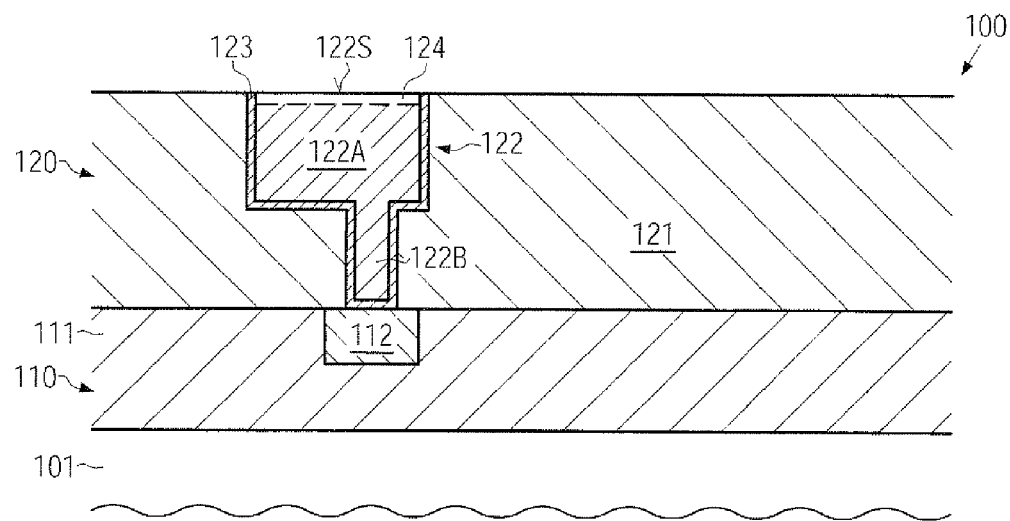
FIGS. 1a-1c schematically illustrate cross-sectional views of a semiconductor device during various manufacturing stages in forming a metallization layer including a metal region having a metallic species selectively formed in a surface area thereof, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The subject matter of the present disclosure relates to manufacturing techniques for semiconductor devices in which a metallic species may be introduced into a metal region in a selective manner, that is, in a manner such that significant contamination of surface areas of the dielectric material may be avoided. For this purpose, the metallic species, which may be considered as an alloy-forming species, may be brought into contact with the metal region under consideration substantially without contacting the adjacent dielectric material or wherein a thin surface portion of the dielectric material may be removed together with any possible contaminants, when metallic species may be introduced in an intermediate manufacturing stage for forming the metallization layer under consideration. Consequently, the advantageous effects of a metal species, which in some illustrative embodiments may be provided in the form of an atomic species having an atomic radius that is greater than the radius of copper, may therefore be obtained substantially without negatively affecting the characteristics of the dielectric material. In this manner, the inter-diffusion of the metallic species into deeper areas of the metal and into the dielectric cap material may be reduced. The selective positioning of metallic species at and within the surface of the metal region under consideration may be accomplished by appropriately designed deposition and/or diffusion processes, depending on material characteristics, while, in other illustrative aspects, implantation processes, for instance based on appropriately designed implantation masks or on the basis of a "self-masking" regime, may be performed at appropriate manufacturing stages in order to enhance the surface characteristics of metal regions, such as copper-containing regions, with respect to the electromigration performance.

FIG. 1a schematically illustrates a cross-sectional view of a semiconductor device 100 in an advanced manufacturing stage. The semiconductor device 100 may comprise a substrate 101, which may represent any appropriate carrier material, such as semiconductive materials, insulating materials and the like, for forming therein and thereabove respective semiconductive features, such as transistors and the like. For example, the substrate 101 may represent a substantially crystalline semiconductor material, such as silicon, germanium, a semiconductor compound and the like. In other cases, the substrate 101 may comprise, at least partially, an insulating layer, above which an appropriate material layer may be provided which is suitable for forming therein and thereon circuit elements. For convenience, any such circuit elements are not shown in FIG. 1a. Thus, unless otherwise stated in the specification and/or the appended claims, the subject matter disclosed herein should not be considered as being restricted to any specific semiconductor material and carrier material for the substrate 101, including a device layer with circuit elements such as transistors and the like.

The semiconductor device 100 as shown in FIG. 1a may further comprise a layer 110, which may represent a metallization layer, such as the very first metallization layer, which may connect to respective circuit elements on the basis of a contact structure (not shown) and the like. For convenience, the layer 110 may be referred to as a metallization layer which may comprise a dielectric material 111 that may comprise any appropriate material or material composition, as required. For instance, the dielectric material 111 may comprise a low-k dielectric material, i.e., a material having a relative permittivity of 3.0 or less in order to reduce the parasitic capacitance with respect to neighboring metal regions. Furthermore, the metallization layer 110 may comprise a metal region 112, which may be substantially comprised of a highly conductive metal, such as copper, silver, alloys thereof and the like, while, in other cases, contact materials, such as tungsten and the like, may be incorporated in the metal region 112. The metal region 112 may further comprise conductive barrier materials if metals exhibiting increased diffusion activity may be considered, such as copper. In some cases, the metallization layer 110 may further comprise a dielectric cap layer, for instance in the form of silicon nitride, silicon carbide, nitrogen-containing silicon carbide and the like, when a direct contact of the metal region 112 with a further metallization layer 120, i.e., a dielectric material 121 thereof, is considered inappropriate. The second metallization layer 120 may further comprise a metal region 122, for instance in the form of a trench 122A and a via 122B. Furthermore, in the embodiment shown, the metal region 122 may comprise a highly conductive metal, such as copper, which may require a confinement by an appropriately designed barrier layer 123. For example, appropriate barrier materials in a copper-based metallization regime are tantalum, tantalum nitride, titanium, titanium nitride, a plurality of compounds such as cobalt, tungsten, phosphorous, or a compound of cobalt, tungsten, boron, compounds of nickel, molybdenum, boron and the like. As previously discussed, the electromigration effects at an interface between the barrier layer 123 and the highly conductive metal in the metal region 122 may be less pronounced, while, typically, a dominant failure mechanism may occur at a surface 122S of the region 122 when brought into contact with a dielectric material of a following metallization layer.

The semiconductor device 100 as shown in FIG. 1a may be formed on the basis of well-established process techniques. That is, circuit elements, possibly in combination with other microstructural features, may be formed at any appropriate level above the substrate 101, as previously explained, wherein transistor elements may be formed on the basis of critical dimensions on the order of magnitude of 50 nm and less, as are typically used in sophisticated integrated circuits, such as CPUs and the like. Thereafter, an appropriate contact structure, for instance the layer 110, may be formed to provide electrical connection to conductive semiconductor areas of the circuit elements previously formed. Next, one or more metallization levels may be provided, when the layer 110 may not represent the very first metallization layer. Thereafter, the dielectric material 111 may be deposited on the basis of any appropriate technique, wherein it should be appreciated that well-established material compositions, for instance including etch stop layers and the like, may be incorporated in the material 111. Subsequently, well-established patterning regimes may be used to form openings corresponding to the metal region 112, which may typically be provided in the form of a metal line or a contact portion, depending on the device requirements. Thereafter, a metal may be filled in the opening, wherein respective techniques may be used, as will be described with reference to the metallization layer 120 and subsequent embodiments described with reference to the further drawings. Thus, after completing the metallization layer 110, the dielectric material 121 may be deposited, for instance by using appropriate techniques for applying a low-k material, followed by sophisticated patterning techniques for forming an opening for the via 122B and the trench 122A. It should be appreciated that, in the embodiment shown in FIG. 1a, the openings for the via 122B and the trench 122A may have been formed so as to connect to each other in order to enable a common filling in of the barrier material 123 and the highly conductive metal, such as copper. In other cases, the via 122B and the trench 122A may be formed in separate patterning sequences, which may also be encompassed by the principles disclosed herein.

In the following description, it may be referred to as a process for commonly filling the via 122B and the trench 122A, which may also be referred to as a dual damascene approach. Thus, the barrier layer 123 may be deposited by using well-established techniques, such as sputter deposition, chemical vapor deposition (CVD), atomic layer deposition (ALD), electrochemical deposition and the like. Thereafter, the highly conductive metal may be deposited, wherein, frequently, a so-called seed layer may be provided, which may also be deposited on the basis of sputter deposition, ALD, CVD, electrochemical deposition and the like. Next, the volume material may be deposited, for instance, by electroless plating, electroplating and the like. Typically, excess material may be deposited so as to reliably fill the via 122B and the trench 122A, thereby requiring a subsequent removal of the excess material in order to provide the metal region 122 as an isolated feature. A respective removal of excess material may be accomplished by using removal techniques such as chemical mechanical polishing (CMP), electro-CMP, etching, electro-etching and the like. Consequently, after the end of this process sequence, the surface 122S may be exposed. In some illustrative embodiments, the exposed surface 122S may be treated, when highly reactive metals, such as copper, are used for the metal region 122. That is, during the removal of the excess material and in any subsequent substrate handling processes, the exposed surface 122S may come into contact with reactive components, such as fluorine, oxygen and the like, which may result in the creation of a locally varying degree of surface contamination. Hence, in some illustrative embodiments, a passivation layer 124, for instance in the form of copper oxide and the like, may be provided to obtain enhanced uniformity during the further processing for selectively providing a metallic species in and at the surface 122S. For example, after exposing the surface 122S, an oxidizing ambient may be established in order to controllably create a thin copper oxide layer, which may continuously cover the surface 122S.

Figure 1B:
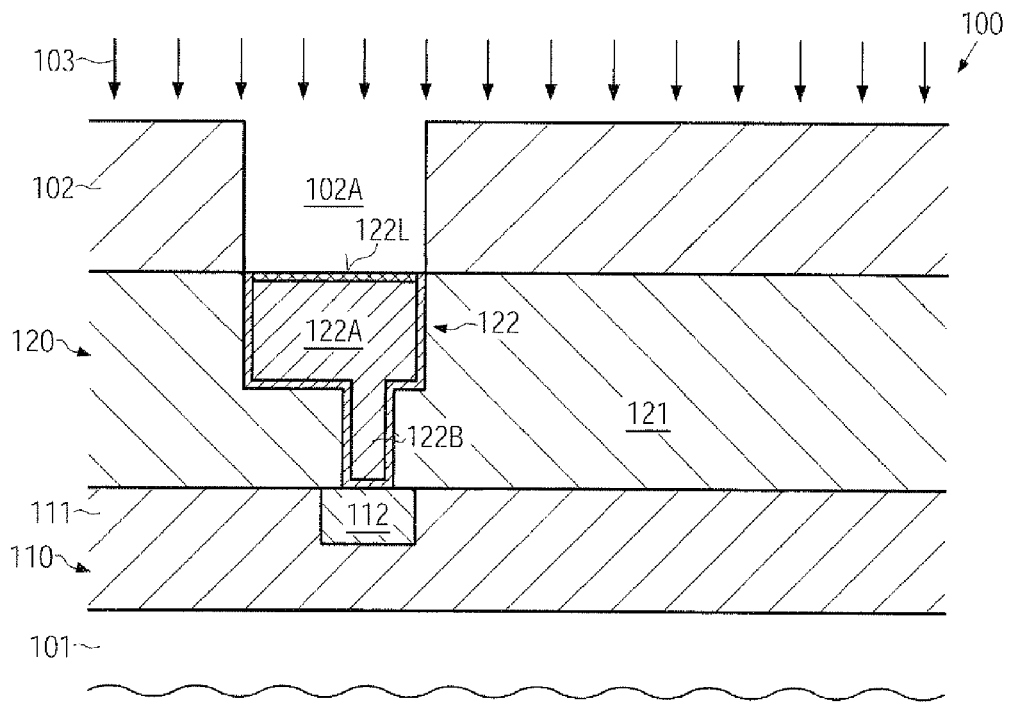

FIG. 1b schematically illustrates the semiconductor device 100 in a further advanced manufacturing stage. As shown, a mask 102, which may be provided in the form of a resist mask, is formed above the metallization layer 120 and includes an opening 102A for exposing the surface 122S or the corresponding passivation layer 124, if provided. The mask 102 may be patterned on the basis of a lithography step using the same mask as previously used for patterning the trench 122A. During the application of the resist material and the subsequent patterning and post-exposure treatment, the passivation layer 124 may suppress any interaction with the material in the trench 122A. After patterning of the mask 102, a surface treatment process 103 may be performed to selectively introduce a desired metallic species, such as nickel, tin, cobalt and the like. In some illustrative embodiments, the atomic radius of the metal species may be comparable and advantageously greater than the atomic radius of copper, thereby reducing inter-diffusion of the metallic species during the further processing and the operation of the device 100. In one illustrative embodiment, the treatment 103 may comprise a plasma treatment performed in plasma ambient containing the desired metallic species. For this purpose, any appropriate process tool for plasma assisted deposition or etching may be used for establishing the plasma ambient, wherein appropriate process parameters, such as plasma power, bias power and the like, may be determined by experimentally determining a penetration depth and a concentration of the metallic species for a plurality of different process conditions. In some illustrative embodiments, the treatment 103 may include a preceding cleaning process, for instance, for removing surface contamination or the passivation layer 124, if deemed inappropriate for the incorporation of the desired metallic species.

In other illustrative embodiments, the surface treatment process 103 may comprise an ion implantation process, which may be performed on the basis of appropriately adjusted process parameters, such as implantation energy, dose and the like. For example, moderately low implantation energies of several keVs to several tens of keVs may be used in combination with implantation species, such as nickel, tin, cobalt and the like. Respective parameter settings may be readily established by simulation and/or experiment in order to obtain a desired penetration depth and concentration. For example, the metallic species may be incorporated into the surface 122S with a thickness of one to several nanometers, thereby generating a surface layer 122L containing a desired concentration of the metallic species under consideration. For instance, a concentration of approximately 0.05 to several atomic percent may be incorporated during the process 103, thereby enhancing the overall surface characteristics, as previously discussed. It should be appreciated that the passivation layer 124, if provided, may be maintained in some cases, wherein the implantation energy may be appropriately adjusted to obtain the desired penetration depth and thickness of the layer 122L after removing the passivation layer 124 at any appropriate manufacturing stage.

Figure 1C:
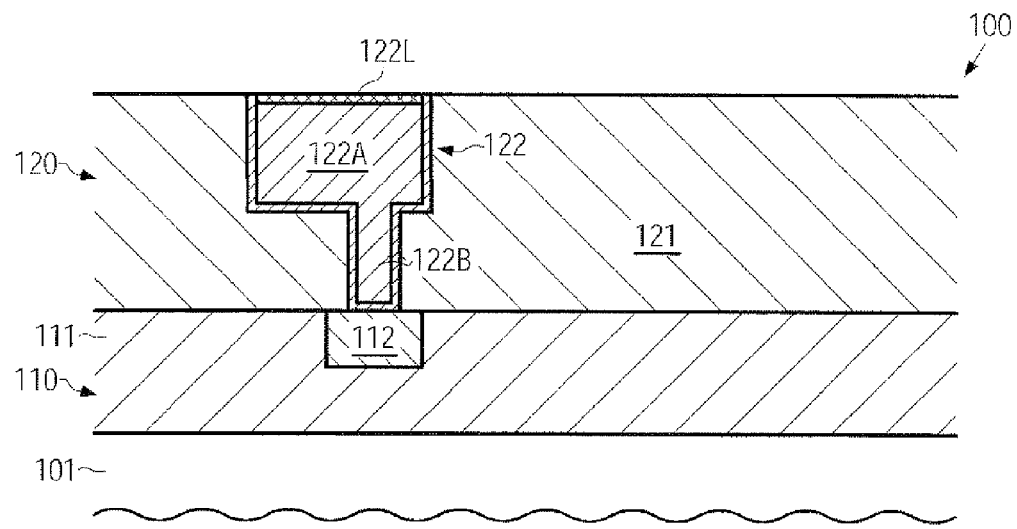

FIG. 1c schematically illustrates the semiconductor device 100 after the removal of the mask 102. Consequently, the metal region 122 may comprise the layer 122L of enhanced electromigration behavior, possibly in combination with the passivation layer 124. The further processing may then be continued by depositing a dielectric cap layer, for instance in the form of silicon nitride, silicon carbide, nitrogen-containing silicon carbide and the like, followed by the deposition of the dielectric material of a following metallization layer. It should be appreciated that, in some illustrative embodiments, a heat treatment may be performed after the incorporation of the metallic species 122L to promote the formation of an alloy and thus stabilize the characteristics of the layer 122L. For example, during this heat treatment, the crystallographic configuration of the metal in the region 122 may also be adjusted, for instance, in view of grain size, grain orientation and the like.

Figure 1D:
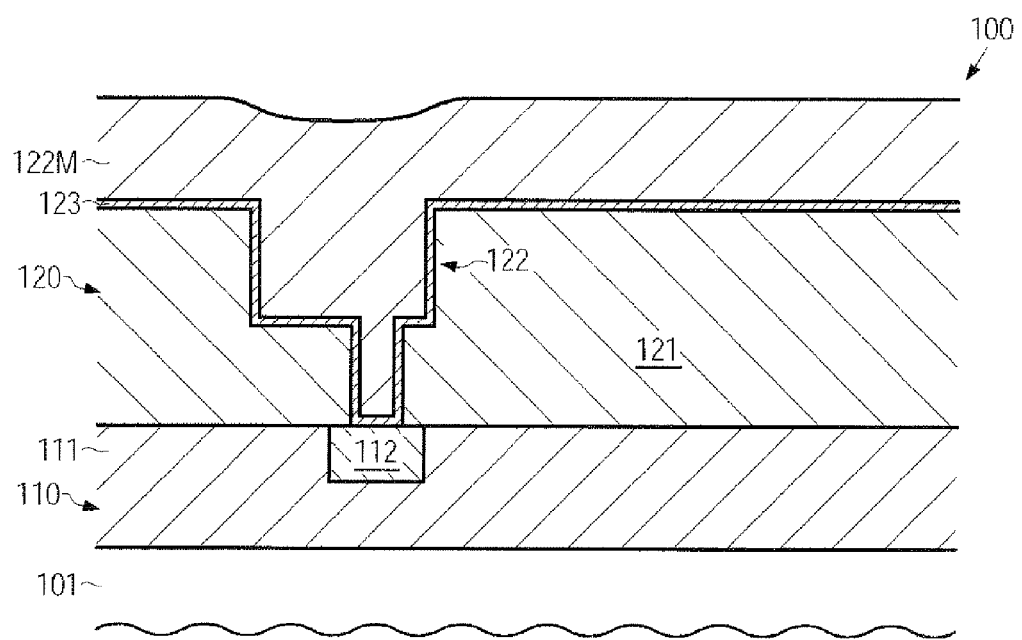
FIGS. 1d-1h schematically illustrate the semiconductor device during various manufacturing stages, wherein a metallic species may be formed on the surface of a metal line in an intermediate stage of forming the metal line, according to illustrative embodiments.

FIG. 1d schematically illustrates the semiconductor device 100 according to further illustrative embodiments. The device 100 is shown in a manufacturing stage in which a metal layer 122M may have been formed, on the basis of deposition techniques, as previously described. Thus, the metal layer 122M may be formed above the dielectric material 121 and within the opening defining the metal region 122.

Figure 1E:
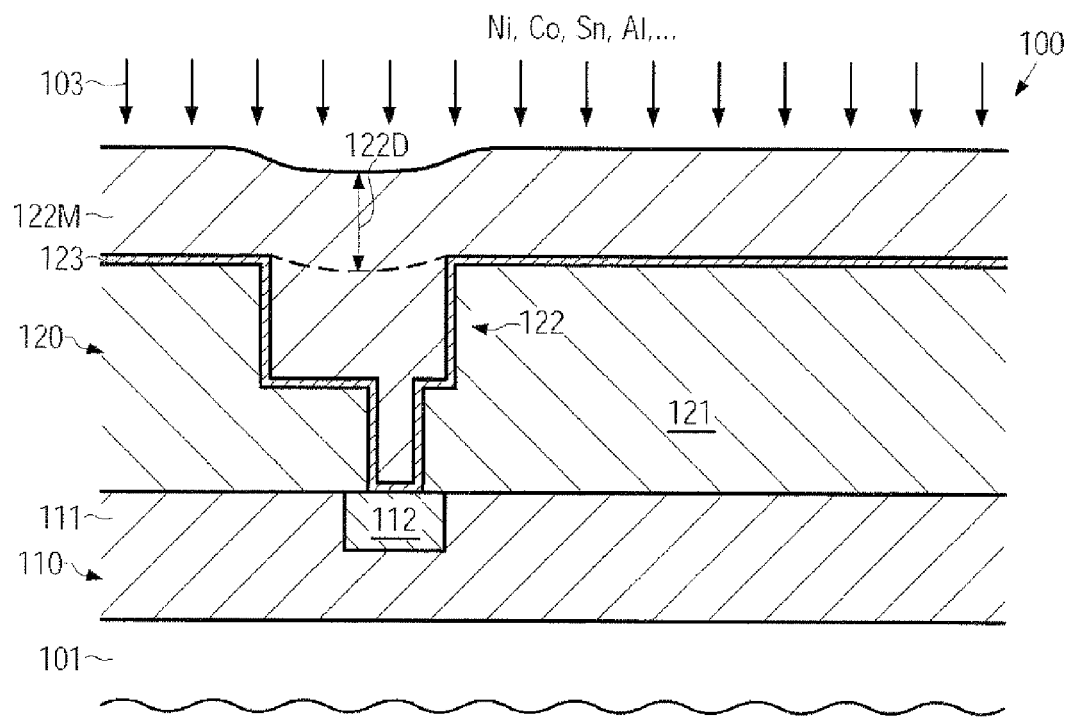

FIG. 1e schematically illustrates the device 100 during the treatment 103, which now comprises an ion implantation process based on process parameters to introduce the metallic species down to a desired depth, as indicated by arrow 122D and the dashed line. As illustrated, the conductive barrier layer 123 may cover the dielectric material 121 and may thus provide ion stopping capabilities, depending on the composition of the barrier layer 123. In other cases, the surface topography of the layer 123 may in itself provide increased penetration of the metal region 122 due to a reduced height level with respect to the height level defined by the dielectric material 121. Thus, the implantation energy may be adjusted such that significant penetration into the dielectric material 121 may be prevented, while, nevertheless, obtaining a desired concentration of the metallic species at a height level within the region 122, which may correspond at least to the surface after the removal of the excess material of the layer 122M. Moreover, during a subsequent removal process, which may comprise a CMP process, the barrier layer 123 may have to be reliably removed from horizontal portions of the dielectric material 121, thereby typically requiring a certain degree of over-polishing, during which a certain amount of the dielectric material 121 may also be removed. Consequently, undesired metallic species contained therein may also be reliably removed, since the implantation energy may be selected such that the penetration depth is restricted to a portion of the dielectric material 121, which may be reliably removed during the subsequent CMP process.

Figure 1F:
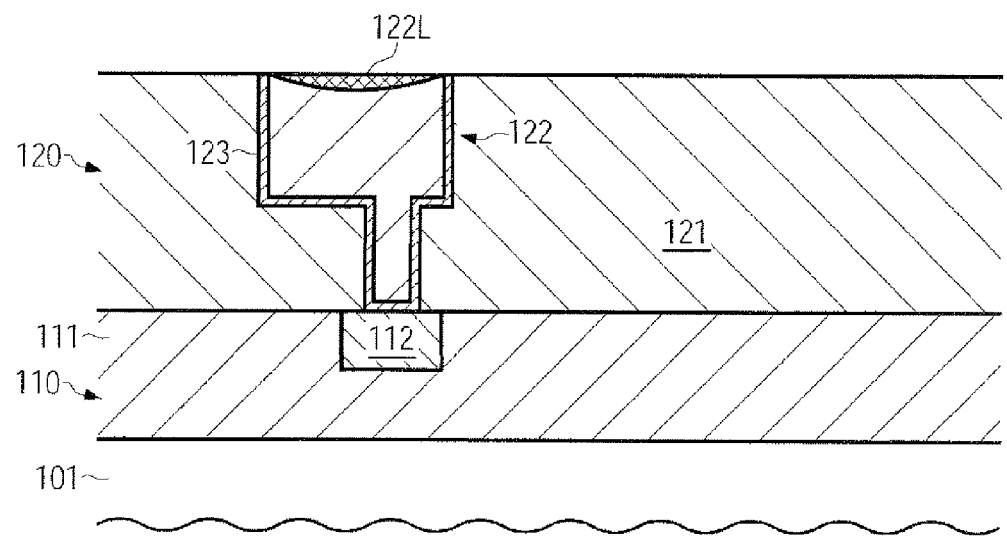

FIG. 1f schematically illustrates the device 100 after removal of the excess material. As illustrated, the metallic species in the form of the layer 122L may be provided on the metal region 122, while a contamination of the dielectric material 121 may be maintained at a low level, as discussed above. Thereafter, the further processing may be continued, for instance, by performing a heat treatment and the like, followed by the deposition of an appropriate dielectric cap material, possibly in combination with a further metallization level.

Hence, the implantation process 103 as shown in FIG. 1e may be performed as a "self-masking" and self-adjusted process, since the metallic species may be substantially positioned in and on the metal region 122, while undesired amounts of the metallic species, if incorporated in the dielectric material 121, may be subsequently removed without requiring additional process steps.

Figure 1G:
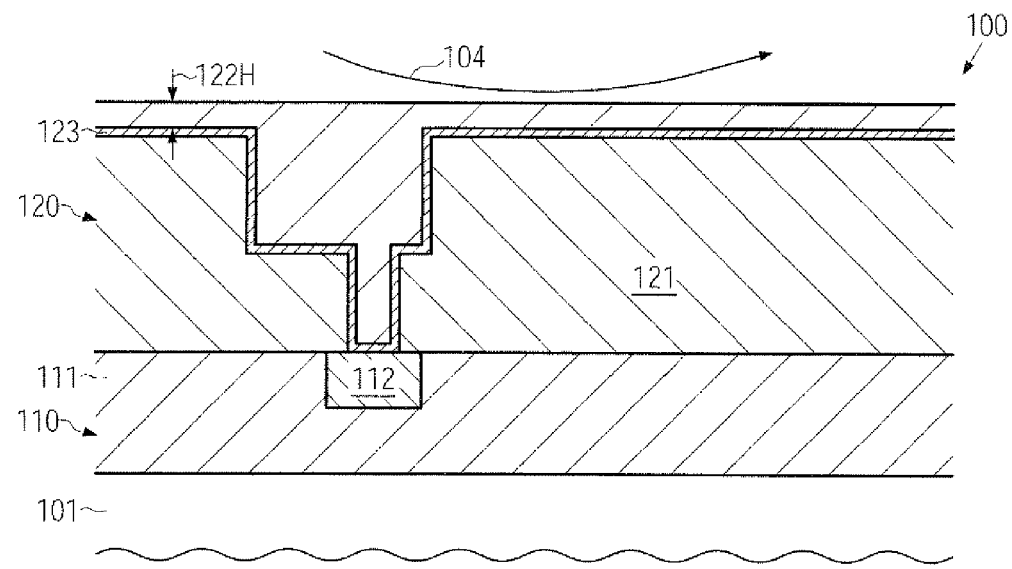

FIG. 1g schematically illustrates the semiconductor device 100 according to still further illustrative embodiments, in which, starting from the configuration as shown in FIG. 1d, a first removal step 104 may be performed to reduce an initial thickness of the layer 122M to a second excess height 122H, thereby also providing a substantially planar surface topography. In some illustrative embodiments, the excess height 122H may be substantially zero, thereby exposing the barrier layer 123, which may provide enhanced controllability of the removal process 104. Thus, based on enhanced surface topography and the defined excess height 122H, the process parameters of the subsequent implantation process 103 may be adjusted with enhanced accuracy, thereby providing increased process uniformity and thus uniformity of the layer 122L.

Figure 1H:
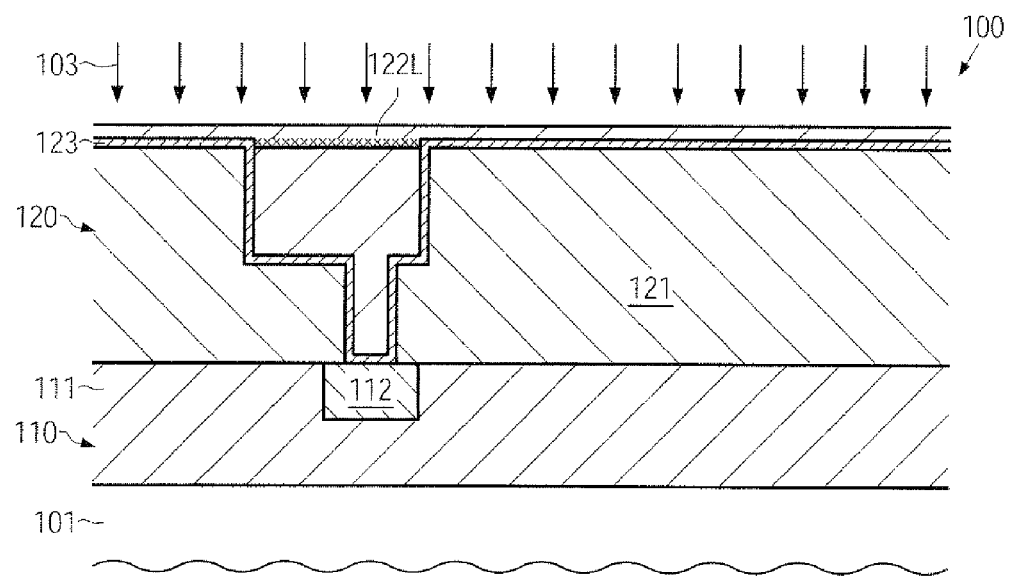

FIG. 1h schematically illustrates the device 100 during the process 103, thereby positioning the metallic species at a desired depth for forming the layer 122L, wherein significant penetration of the dielectric material 121 may be blocked by the barrier material 123 and/or may occur with increased uniformity, thereby also enhancing the result of the subsequent removal of the barrier layer 123 including the metallic species. In other illustrative embodiments, the excess height 122H may be approximately zero, thereby exposing the surface 122, while substantially maintaining the barrier layer 123. In this case, appropriate plasma treatments may be performed, thereby providing a desired penetration depth, which may result in enhanced cycle time and uniformity, substantially without contributing to a contamination of the dielectric material 121. Thereafter, the barrier material 123 and any excess material of the layer 122M may be removed and the further processing may be continued, as described above.

Figure 1I:
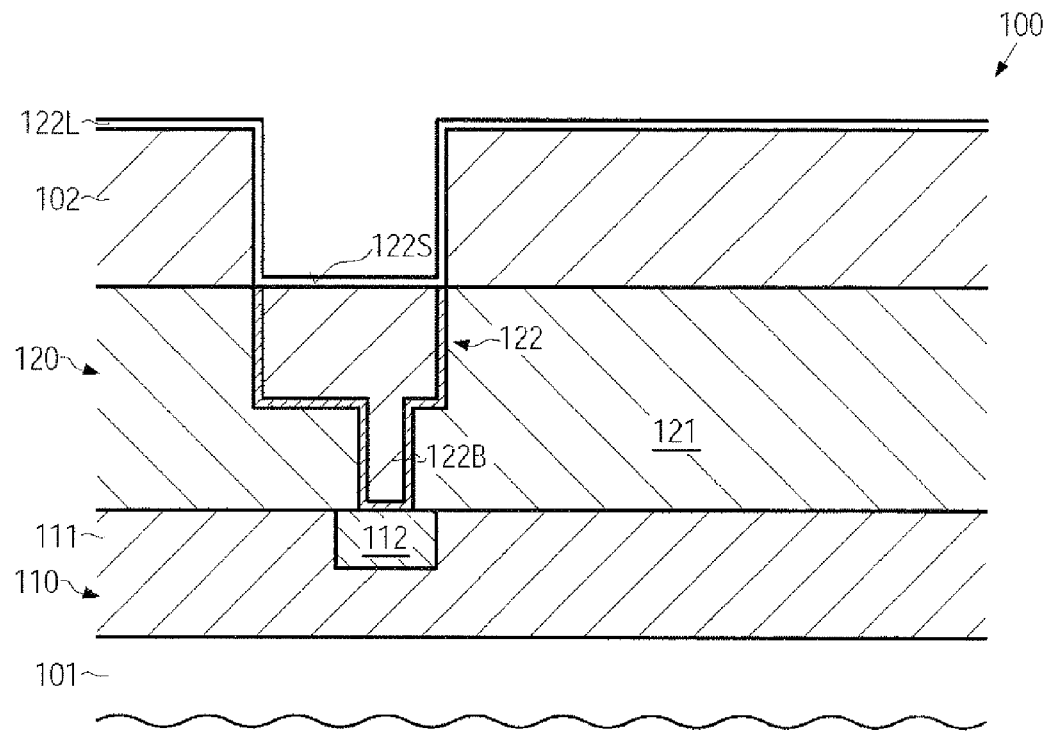
FIGS. 1i-1j schematically illustrate the semiconductor device during various manufacturing stages in selectively providing a metal layer containing an appropriate metallic species for enhancing the electromigration behavior of an underlying metal line, according to yet other illustrative embodiments.

FIG. 1i schematically illustrates the device 100 according to still further illustrative embodiments, in which the mask 102 may be used as a deposition mask for selectively forming the layer 122L, which may comprise the desired metallic species, while substantially avoiding the contact of the layer 122L with the dielectric material 121. For example, electrochemical deposition techniques may be used, for instance, preceded by the deposition of an appropriate catalyst material, if the exposed surface 122S (see FIG. 1*j*) may be considered inappropriate for a desired electrochemical deposition. In other cases, the electrochemical deposition process may be a self-catalyzing process, thereby substantially avoiding the deposition of the layer 122S on exposed portions of the mask 102. Thus, the mask 102 may reliably suppress a contact of the material 121 with a corresponding electrolyte solution. The mask 102 may be efficiently removed on the basis of well-established techniques. In other illustrative embodiments, the layer 122S may be deposited on the basis of a gaseous ambient, for instance, by performing a physical vapor deposition process or a chemical vapor deposition process, wherein a process temperature may be maintained at approximately 200° C. and less to avoid significant chemical modifications in the structure of the mask 102, if provided as a resist mask.

After the deposition of the layer 122S including the metallic species, the mask 103 may be removed, for instance, by applying heat so as to peel off the mask 103 together with the layer 122S. It should be appreciated that, during the corresponding removal process, contamination of exposed portions of the dielectric material 121 may remain at a low level since removed pieces of the layer 122S may not substantially come into contact with the dielectric material 121. After the removal of the mask 103, a heat treatment may be performed, for instance, for stabilizing the layer 122S and/or for generating a certain degree of inter-diffusion or to promote the formation of an alloy to enhance the overall strength of the surface 122S comprising the layer 122L.

Figure 1J:
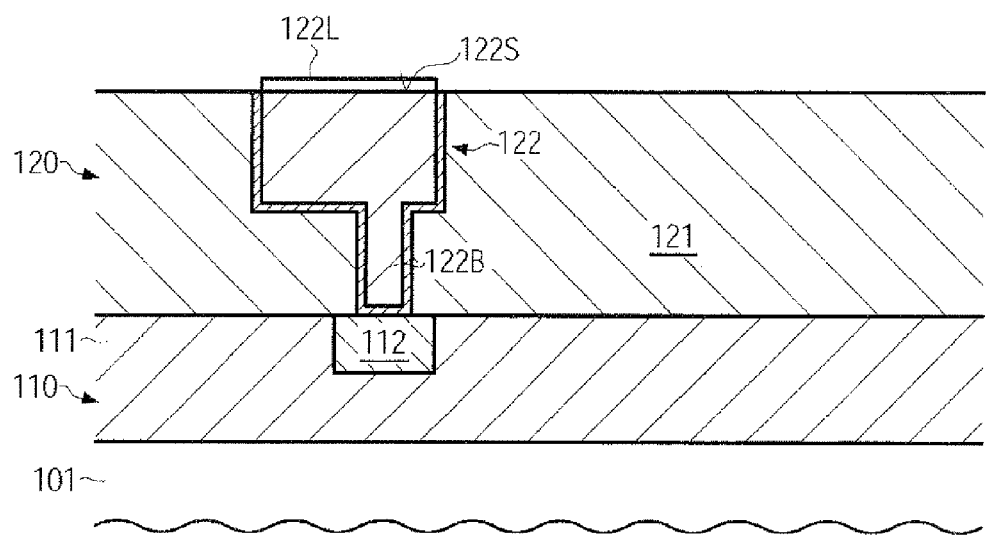

FIG. 1*j* schematically illustrates the device 100 with the layer 122L selectively formed on the surface 122S. For example, the layer 122L may represent the result of the process after removing the mask 102, while, in other illustrative embodiments, the layer 122L may be deposited above the metal region 122 and the dielectric material 121 if significant reaction of the metallic species in the layer 122L with the dielectric material 121 may not substantially occur at temperatures used during the deposition of the layer 122L and the subsequent patterning thereof. For example, a lithography mask may be formed after the deposition of the layer 122L and exposed portions thereof, i.e., portions not formed on the dielectric layer 121, may be removed on the basis of any appropriate etch techniques.

Figure 1K:
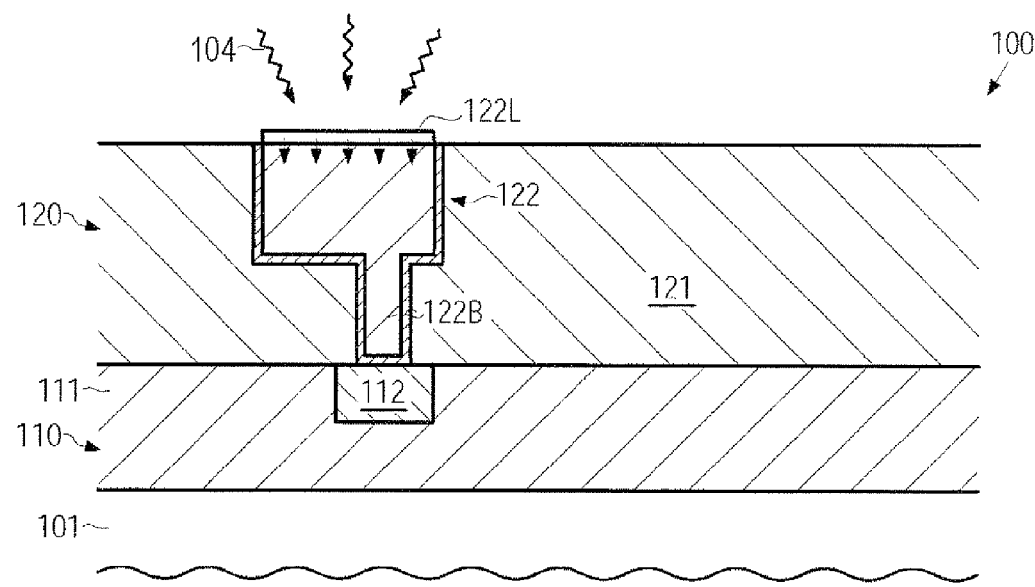
FIG. 1k schematically illustrates a cross-sectional view of a metallization layer during a diffusion process for selectively driving a metallic species into the surface of a metal layer, according to still further illustrative embodiments.

FIG. 1*k* schematically illustrates the device 100 during a heat treatment 104 for initiating a diffusion of the metallic species within the layer 122L into the metal of the metal region 122. In some illustrative embodiments, the layer 122L may be removed after the process 104 if a direct contact with a further dielectric material may be deemed inappropriate. Hence, the layer 122L may act as a donator for the desired metallic species during a heat treatment 106, while substantially not affecting the dielectric material 121.

Figure 1L:
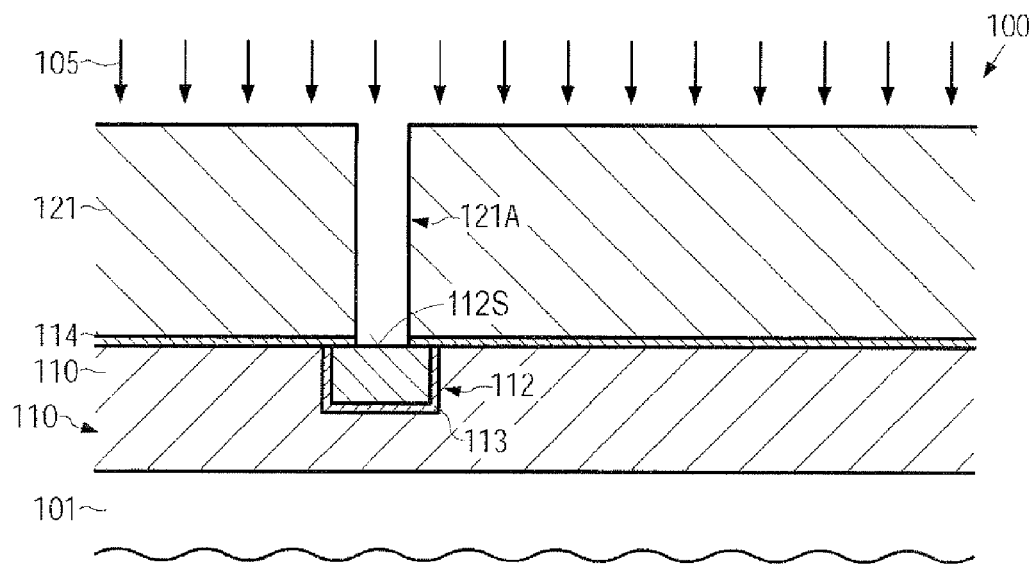
FIGS. 1l-1m schematically illustrate cross-sectional views of the semiconductor device when forming a via opening through which the species may be incorporated into an exposed surface portion of a metal region, according to still other illustrative embodiments.

As shown in FIG. 1*l*, after the anisotropic etch process, a further etch process 105 may be performed that is designed to remove the remaining material of the etch stop layer 114 within the via opening 121A. For example, the remaining etch stop material may be removed during the removal of a corresponding resist mask using an oxygen-based plasma ambient, possibly in combination with a fluorine component. Hence, after the etch process 105, a portion of the surface of the metal region 112 may be exposed, as indicated by 112S. That is, the portion 112S may have substantially the lateral dimension as the via 122B to be formed in the via opening 121A.

Figure 1M:
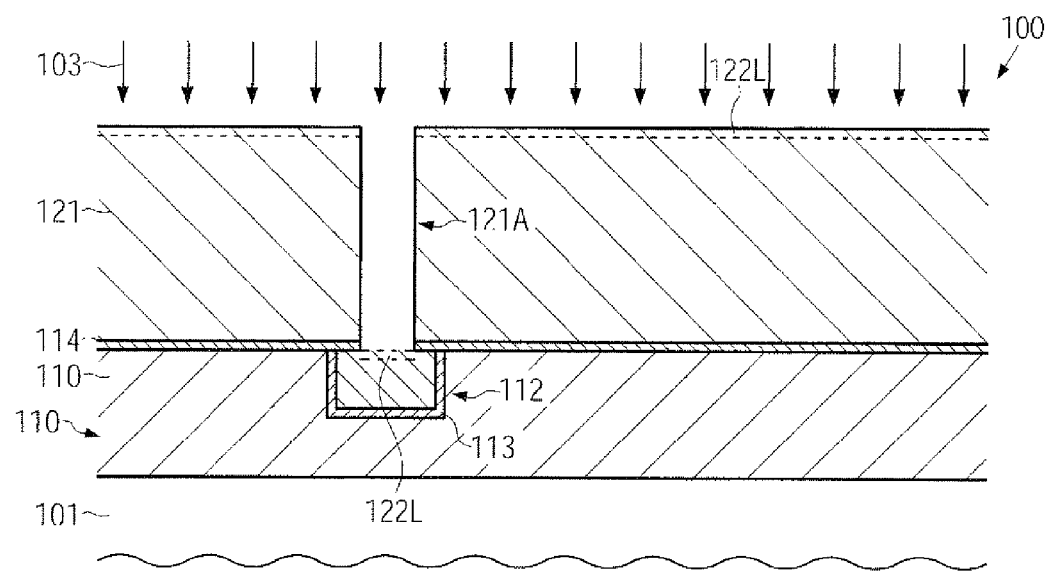

FIG. 1*m* schematically illustrates the device 100 during the ion implantation process 103 for introducing the metallic species into the exposed surface portion 112S on the basis of appropriately selected implantation parameters. Thus, a respective layer 122L may be created at a portion at which the via 122B will connect to the metal region 112, thereby providing enhanced electromigration stability at this area. It should be appreciated that a metallic species may also be incorporated into the surface portion of the dielectric material 121, wherein, however, a penetration depth may be moderately low since low implantation energies may be used, as the layer 122L may be required at the surface portion 112S only. Consequently, during the further processing, that is, during a patterning process for forming a trench opening and a subsequent filling of the via opening 121A and the overlying trench opening, the barrier material 123 and the metal layer 122M (FIG. 1*d*) may be deposited, as described above. In some illustrative embodiments, in this stage, the metallic species may be incorporated, for instance, by an ion implantation process, as previously described, while, in other cases, the metallic species may be applied at a later manufacturing stage, as described with the preceding embodiments. In still other cases, the layer 122L in the exposed surface portion 112S may be considered sufficient for obtaining the desired enhancement in electromigration resistance. In any case, the excess material of the layer 122M may be removed by a process, including a CMP process, at least at a final phase, thereby also removing a certain amount of the dielectric layer 121, as previously explained. Hence, during this removal process, the metallic species formed in a surface portion of the dielectric layer 121 may be significantly reduced or may be substantially completely removed, thereby reducing or suppressing a negative effect on the dielectric characteristics of the layer 121.

As a result, the principles disclosed herein provide techniques for enhancing the electromigration behavior of metallization systems of advanced semiconductor devices by "selectively" providing a metallic species at least on a portion of the surface of a metal region. For this purpose, in illustrative aspects, an implantation process may be performed on the basis of an implantation mask or on the basis of self-masking mechanisms and/or a selective deposition and diffusion mechanism may be employed. By using an implantation process for selectively incorporating a metallic species, the implantation parameters may be appropriately tuned to obtain a desired resistivity of the implanted portion of the basis material. That is, since implantation parameters such as dose and energy may be finely tuned for any given metallic species, the overall concentration and the vertical concentration profile may be appropriately adjusted so as to not unduly increase the overall resistivity of the implanted portion and thus of the metal region under consideration but nevertheless provide an enhanced resistance against electromigration effects. Consequently, the overall electrical resistivity of metal lines may not be unduly increased while nevertheless significantly enhancing the interface characteristic with an overlying dielectric cap layer. On the other hand, unwanted interaction of the metallic species with the dielectric material may be suppressed or substantially completely avoided, thereby maintaining additional leakage currents at a low level.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
    forming a metal layer above a dielectric layer of a metallization layer of a semiconductor device so as to fill an opening in said dielectric layer and extend above said dielectric layer;
    performing an implantation process to introduce a metallic species through an exposed surface of said metal layer; and
    removing excess material of said metal layer extending above said dielectric layer after performing said implantation process to form a metal region in said dielectric layer, said metal region having a surface comprising said metallic species.

2. The method of claim 1, further comprising forming a conductive barrier material on said dielectric layer and an inner surface of said opening prior to forming said metal layer.

3. The method of claim 2, wherein forming said metal layer comprises depositing said metal layer by performing an electrochemical deposition process.

4. The method of claim 1, wherein said metal layer comprises copper and said metallic species is a non-copper containing species.

5. The method of claim 4, wherein said metallic species has an atomic radius that is greater than an atomic radius of copper.

6. The method of claim 1, wherein forming said metal layer comprises depositing a metal material with a first excess height and removing a portion of said metal material to obtain a second reduced excess height prior to performing said implantation process.

7. The method of claim 6, wherein removing the portion of said metal material to obtain the second reduced excess height prior to performing said implantation process comprising performing a chemical mechanical polishing process.

8. The method of claim 1, further comprising forming a lower metallization layer prior to forming said metallization layer, wherein said lower metallization layer comprises a metal line and wherein said method further comprises forming said dielectric layer above said lower metallization layer, forming a via opening in said dielectric layer to expose a portion of said metal line and introducing said metallic species into a surface of said exposed portion.

9. The method of claim 8, wherein said metallic species is introduced by implanting said metallic species through said via opening.

* * * * *